United States Patent
Kobayashi et al.

(10) Patent No.: US 12,068,181 B2
(45) Date of Patent: Aug. 20, 2024

(54) MANUFACTURING METHOD FOR GLASS SUBSTRATE AND GLASS SUBSTRATE

(71) Applicant: AGC Inc., Tokyo (JP)

(72) Inventors: Yuha Kobayashi, Chiyoda-ku (JP); Yuichi Yoshida, Chiyoda-ku (JP); Keisuke Hanashima, Chiyoda-ku (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 18/479,872

(22) Filed: Oct. 3, 2023

(65) Prior Publication Data

US 2024/0030051 A1    Jan. 25, 2024

Related U.S. Application Data

(63) Continuation of application No. PCT/JP2022/016053, filed on Mar. 30, 2022.

(30) Foreign Application Priority Data

Apr. 6, 2021    (JP) .................................. 2021-064972

(51) Int. Cl.
     *B32B 3/00*        (2006.01)
     *C03C 15/02*      (2006.01)
     (Continued)

(52) U.S. Cl.
     CPC ........ *H01L 21/67288* (2013.01); *C03C 15/02* (2013.01); *H01L 21/304* (2013.01);
     (Continued)

(58) Field of Classification Search
     CPC ........ H01L 21/304; H01L 22/12; C03B 15/02
     See application file for complete search history.

(56) References Cited

FOREIGN PATENT DOCUMENTS

JP        6443668 B2     12/2018

OTHER PUBLICATIONS

International Search Report dated Jun. 14, 2022 in PCT/JP2022/016053 filed on March 30, 2022, 2 pages.

*Primary Examiner* — Elizabeth E Mulvaney
(74) *Attorney, Agent, or Firm* — Oblon, McClelland, Maier & Neustadt, L.L.P.

(57) ABSTRACT

To suppress lowering of dimensional accuracy. A manufacturing method for a glass substrate is a manufacturing method for the glass substrate that supports a semiconductor device, the manufacturing method including: generating a glass base plate; measuring a thickness, a thickness deviation, and a warpage amount of the glass base plate; screening the glass base plate based on the thickness of the glass base plate; generating a plurality of glass blanks by cutting the screened glass base plate; setting a first polishing condition for the glass blank based on the thickness, the thickness deviation, and the warpage amount of the glass base plate; generating a glass plate by polishing a surface of the glass blank based on the first polishing condition; measuring a thickness, a thickness deviation, and a warpage amount of the glass plate; screening the glass plate based on the thickness of the glass plate; setting a second polishing condition for the glass plate based on the thickness, the thickness deviation, and the warpage amount of the glass plate; and polishing a surface of the screened glass plate based on the second polishing condition to generate a rectangular glass substrate in which a length of a side is equal to or larger than 300 mm and a thickness is equal to or larger than 0.5 mm.

12 Claims, 6 Drawing Sheets

(51) Int. Cl.
   *H01L 21/304* (2006.01)
   *H01L 21/66* (2006.01)
   *H01L 21/67* (2006.01)
   *H01L 23/15* (2006.01)
(52) U.S. Cl.
   CPC ........ *H01L 21/67253* (2013.01); *H01L 22/12* (2013.01); *H01L 23/15* (2013.01)

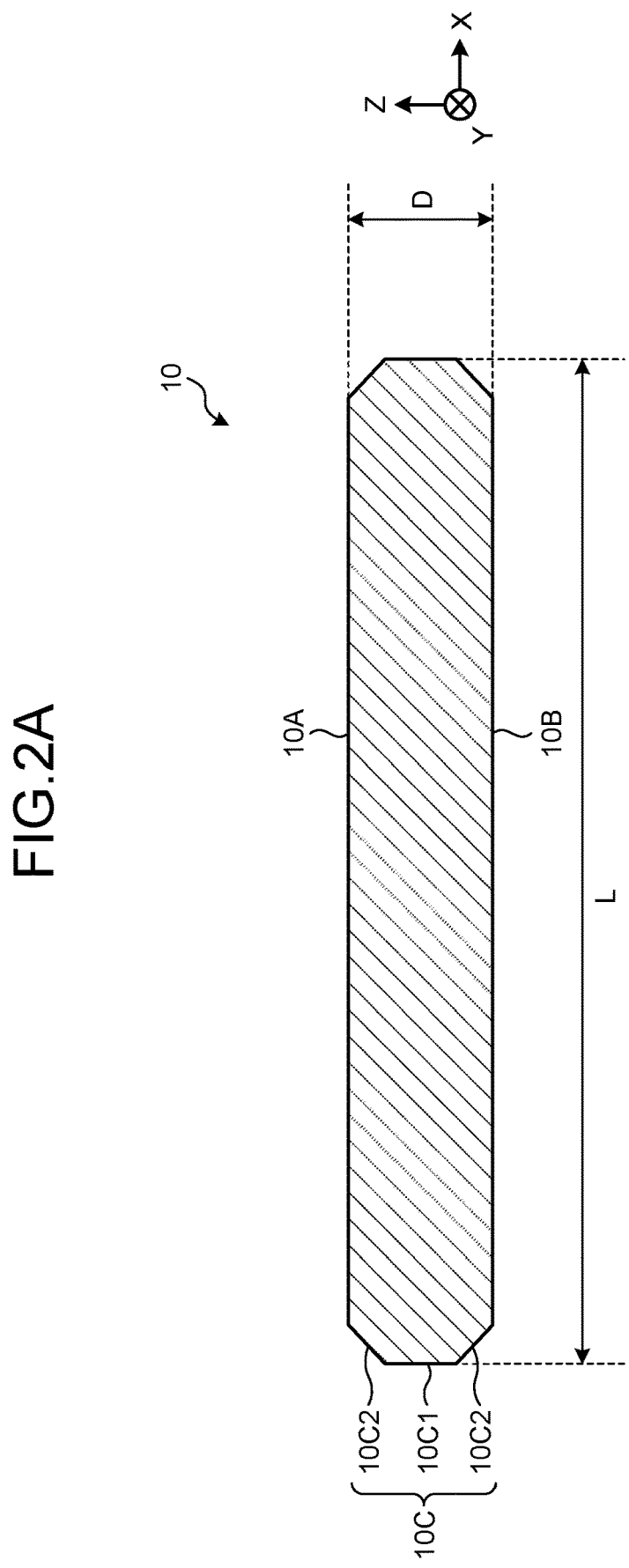

MANUFACTURING METHOD FOR GLASS SUBSTRATE AND GLASS SUBSTRATE

FIELD

The present invention relates to a manufacturing method for a glass substrate and the glass substrate.

BACKGROUND

A glass substrate may be used as a member for supporting a semiconductor device during a manufacturing process for the semiconductor device. For example, Patent Literature 1 discloses a support substrate made of glass for a fan out wafer level package.

CITATION LIST

Patent Literature

Patent Literature 1: Japanese Patent No. 6443668

SUMMARY

Technical Problem

For a glass substrate that supports a semiconductor device, dimensional accuracy of a thickness and warpage equivalent to that of a silicon wafer is required. However, the glass substrate that supports a semiconductor device is multicomponent, and a thickness and an area thereof are larger than those of a silicon wafer, so that high dimensional accuracy is difficult to be secured in some cases. Thus, there is a demand for suppressing lowering of dimensional accuracy.

The present invention is made in view of such a situation, and provides a manufacturing method for a glass substrate that can suppress lowering of dimensional accuracy, and the glass substrate.

Solution to Problem

To solve the problem above, a manufacturing method for a glass substrate that supports a semiconductor device of the present disclosure comprises: generating a glass base plate; measuring a thickness, a thickness deviation, and a warpage amount of the glass base plate; screening the glass base plate based on the thickness of the glass base plate; generating a plurality of glass blanks by cutting the screened glass base plate; setting a first polishing condition for the glass blank based on the thickness, the thickness deviation, and the warpage amount of the glass base plate; generating a glass plate by polishing a surface of the glass blank based on the first polishing condition; measuring a thickness, a thickness deviation, and a warpage amount of the glass plate; screening the glass plate based on the thickness of the glass plate; setting a second polishing condition for the glass plate based on the thickness, the thickness deviation, and the warpage amount of the glass plate; and polishing a surface of the screened glass plate based on the second polishing condition to generate a rectangular glass substrate a length of a side of which is equal to or larger than 300 mm and a thickness is equal to or larger than 0.5 mm.

To solve the problem above, a glass substrate that supports a semiconductor device of the present disclosure has a rectangular shape a length of a side of which is equal to or larger than 300 mm, warpage of the glass substrate is equal to or smaller than 1 mm, a plate thickness of the glass substrate is equal to or larger than 0.5 mm and equal to or smaller than 4.0 mm, a deviation of the thickness of the glass substrate is equal to or smaller than 5 µm, a local thickness variation (LTV) in 50 mm×50 mm of the glass substrate is equal to or smaller than 2 µm, a width of an edge surface part of the glass substrate is equal to or smaller than 1 mm, and a radius of curvature formed by optional three points in a region having the smallest curvature in a boundary region between an edge surface and an end face of the glass substrate is equal to or larger than 0.05 mm.

Advantageous Effects of Invention

According to the present invention, it is possible to suppress lowering of dimensional accuracy.

BRIEF DESCRIPTION OF DRAWINGS

FIG. 2A is an A-A cross sectional view of FIG. 1.

DESCRIPTION OF EMBODIMENTS

The following describes a preferred embodiment of the present invention in detail with reference to the attached drawings. The present invention is not limited to the embodiment, and in a case in which there are a plurality of embodiments, the embodiments combined with each other may be included in the present invention. Numerical values encompass rounded numerical values and a typical tolerance range.

(Glass Substrate)

Figure 1:
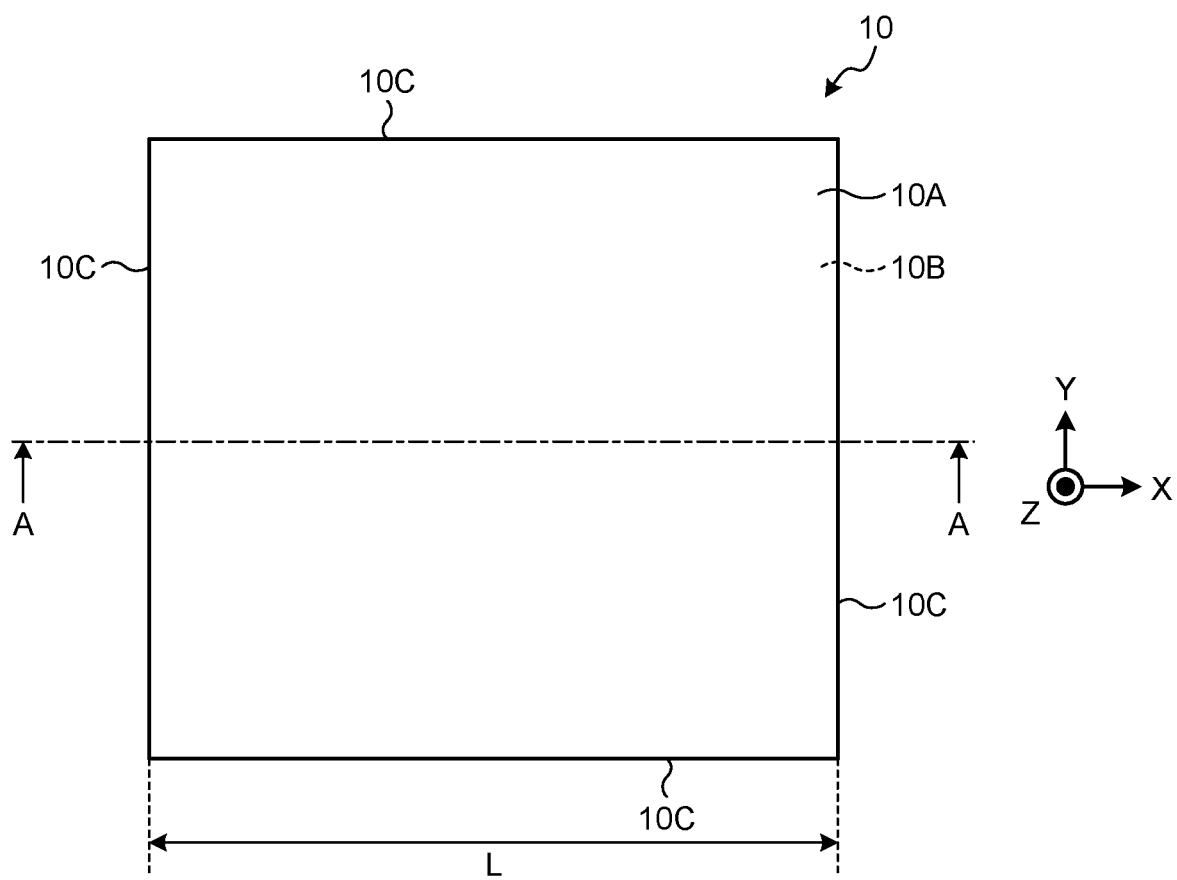
FIG. 1 is a schematic diagram of a glass substrate according to an embodiment.

FIG. 1 is a schematic diagram of a glass substrate according to the present embodiment, and FIG. 2A is an A-A cross sectional view of FIG. 1. A glass substrate 10 according to the present embodiment is used as a glass substrate for manufacturing a semiconductor package, and is a glass substrate that supports a semiconductor device. More specifically, the glass substrate 10 is a support glass substrate for manufacturing a fan out panel level package (FOPLP). However, a use of the glass substrate 10 is not limited to supporting the semiconductor device and manufacturing the FOPLP, but is optional. The glass substrate 10 may be a glass substrate used for supporting an optional member.

As illustrated in FIG. 1, the glass substrate 10 is a plate-shaped member including a surface 10A (one surface) as a principal plane on one side and a surface 10B (the other surface) as a principal plane on the opposite side of the surface 10A. The glass substrate 10 has a rectangular shape in the plane view, that is, when viewed from a direction orthogonal to the surface 10A. More specifically, the glass substrate 10 has a square shape in the plane view, but the shape is not limited to the square shape. The glass substrate 10 may have an oblong shape in the plane view. A notch part may be formed on an end face 10C of the glass substrate 10, and the glass substrate 10 may have a shape obtained by partially notching an outer periphery of a rectangle. Hereinafter, a direction orthogonal to the surface 10A is referred to as a Z-direction. It can also be said that the Z-direction is a thickness direction of the glass substrate 10. A direction orthogonal to the Z-direction is defined as an X-direction, and a direction orthogonal to the Z-direction and the X-direction is defined as a Y-direction.

As illustrated in FIG. 2A, the end face 10C of the glass substrate 10 is a surface that connects the surface 10A to the surface 10B, which can also be called a side surface of the glass substrate 10. The glass substrate 10 includes chamfers formed on the end face 10C. Specifically, the end face 10C includes an end face part 10C1 and edge surface parts 10C2. The end face part 10C1 corresponds to a portion of the end face 10C that is not chamfered, and the edge surface part 10C2 corresponds to a chamfered portion of the end face 10C. Over the entire region in a peripheral direction of the glass substrate 10, the end face 10C has a shape including the end face part 10C1 and the edge surface parts 10C2 as illustrated in FIG. 2A. That is, the glass substrate 10 has a rectangular shape, so that it can be said that the end face parts 10C1 and the edge surface parts 10C2 are formed on the end faces 10C on two sides in the X-direction of the glass substrate 10 and the end faces 10C on two sides in the Y-direction of the glass substrate 10 (that is, on all of the four sides).

The end face parts 10C1 are surfaces each including the most projecting portion of the end face 10C projecting outward in a radial direction of the glass substrate 10. As illustrated in FIG. 2A, the end face part extends along the Z-direction when viewed from a direction orthogonal to the Z-direction.

The end face part 10C1 is connected to the surface of the glass substrate 10 via the edge surface part 10C2. That is, one end part in the Z-direction of the edge surface part 10C2 is connected to the end face part 10C1, and the other end part thereof is connected to the surface of the glass substrate 10. The edge surface parts 10C2 are formed on both sides of the end face part 10C1 in the Z-direction. That is, the end face 10C is formed so that one edge surface part 10C2, the end face part 10C1, and the other edge surface part 10C2 are arranged in this order in the Z-direction. One end part in the Z-direction of the one edge surface part 10C2 is connected to the surface 10A of the glass substrate 10, and the other end part thereof is connected to the end face part 10C1. One end part in the Z-direction of the other edge surface part 10C2 is connected to the end face part 10C1, and the other end part thereof is connected to the surface 10B of the glass substrate 10.

As illustrated in FIG. 2A, the edge surface part 10C2 is inclined with respect to the Z-direction when viewed from the direction orthogonal to the Z-direction. The edge surface part 10C2 is inclined inward in the radial direction of the glass substrate 10 as being closer to the surface side of the glass substrate 10 from the end face part 10C1. The edge surface part 10C2 has a linear shape when viewed from the direction orthogonal to the Z-direction, but may have a curved shape (R shape).

As described above, the end face 10C has a shape including chamfers formed thereon including the end face part 10C1 and the edge surface parts 10C2. However, the shape of the end face 10C is not limited thereto, for example, the chamfers are not necessarily formed thereon.

(Length of One Side of Glass Substrate)

A length L of a side of the glass substrate 10 is preferably equal to or larger than 300 mm, and more preferably equal to or larger than 500 mm. The length L of the side of the glass substrate 10 is preferably equal to or smaller than 1000 mm, and more preferably equal to or smaller than 700 mm. By causing the length L to fall within this range, a size of a region in which a semiconductor device is disposed can be sufficiently secured, and the semiconductor device can be appropriately manufactured. The length L is a length of one side of the glass substrate 10 when viewed from the Z-direction, and indicates a length from the end face 10C (more specifically, the end face part 10C1) of one side of the glass substrate 10 to the end face 10C (more specifically, the end face part 10C1) of the opposite side.

(Thickness of Glass Substrate)

A thickness D of the glass substrate 10 is preferably equal to or larger than 0.5 mm, more preferably equal to or larger than 0.7 mm, and even more preferably equal to or larger than 1.0 mm. The thickness D of the glass substrate is preferably equal to or smaller than 4.0 mm, and more preferably equal to or smaller than 2.0 mm. By causing the thickness D to fall within this range, warpage is suppressed, and the semiconductor device can be appropriately manufactured. The thickness D indicates a length in the Z-direction from the surface 10A to the surface 10B.

In a case of manufacturing a plurality of glass substrates 10 using the manufacturing method according to the present embodiment (described later), a difference in the thickness D between the glass substrates 10 is preferably equal to or smaller than 20 μm, and more preferably equal to or smaller than 5 μm. By causing the difference in the thickness D between the glass substrates 10 (variation of the thickness D between the glass substrates 10) to fall within this range, it is possible to suppress lowering of dimensional accuracy and the like at the time of manufacturing the semiconductor device.

A deviation of the thickness D of the glass substrate 10 is preferably equal to or smaller than 10 μm, more preferably equal to or smaller than 5 μm, and even more preferably equal to or smaller than 3 μm. By causing the deviation of the thickness D to fall within this range, the thickness D of the glass substrate 10 becomes almost uniform, and the semiconductor device can be appropriately manufactured. The deviation of the thickness D indicates a deviation of the thickness D for each position (each pair of coordinates) on a plane along the surface of the glass substrate 10. For example, the thickness D at the position may be calculated for each position (each pair of coordinates) on the plane along the surface of the glass substrate 10, and a difference between a maximum value and a minimum value of thicknesses D at respective positions may be caused to be the deviation of the thickness D.

A local thickness variation (LTV) in the glass substrate 10 of 50 mm×50 mm is preferably equal to or smaller than 2 μm, and more preferably equal to or smaller than 1 μm. The LTV in 50 mm×50 mm indicates a difference between a maximum value and a minimum value of the thickness D in a unit region of 50 mm×50 mm of the glass substrate 10. In other words, the deviation of the thickness D indicates a difference between the maximum value and the minimum value of the thickness D in the entire region of the glass substrate 10, but the LTV indicates a difference between the maximum value and the minimum value of the thickness D in the unit region of the glass substrate 10.

Of the entire region of the glass substrate 10, an outer side region is defined as a region between a position separated from a periphery by 1 mm inwardly in the radial direction and a position separated from the periphery by 5 mm inwardly in the radial direction. Of the entire region of the glass substrate 10, a center side region is defined as a region surrounded by a square each side of which is 100 mm centered on a center point O of the glass substrate 10. In this case, an average value of the thicknesses D of the glass substrate 10 in the outer side region may be larger than an average value of the thicknesses D of the glass substrate 10 in the center side region (that is, the center part may be thicker). In contrast, the average value of the thicknesses D of the glass substrate 10 in the outer side region may be smaller than the average value of the thicknesses D of the glass substrate 10 in the center side region (that is, the center part may be thinner). The deviation of the thickness D in the center side region and the deviation of the thickness D in the outer side region are preferably equal to or smaller than 2 µm, and more preferably equal to or smaller than 1 µm. As a manufacturing method for achieving such a shape the center part of which is thinner or thicker, for example, a pressure at the center of the glass substrate 10 or a relative velocity of a polishing fabric may be increased in physical processing such as polishing. For example, in hydrofluoric acid (HF) etching, to selectively etch the center of the glass substrate 10, an outer peripheral part may be masked, the center part of the glass substrate 10 may be heated, or a chemical liquid flow channel may be adjusted so that a fresh chemical liquid is always in contact with the center part of the glass substrate 10.

(Deflection of Glass Substrate)

Figure 3:
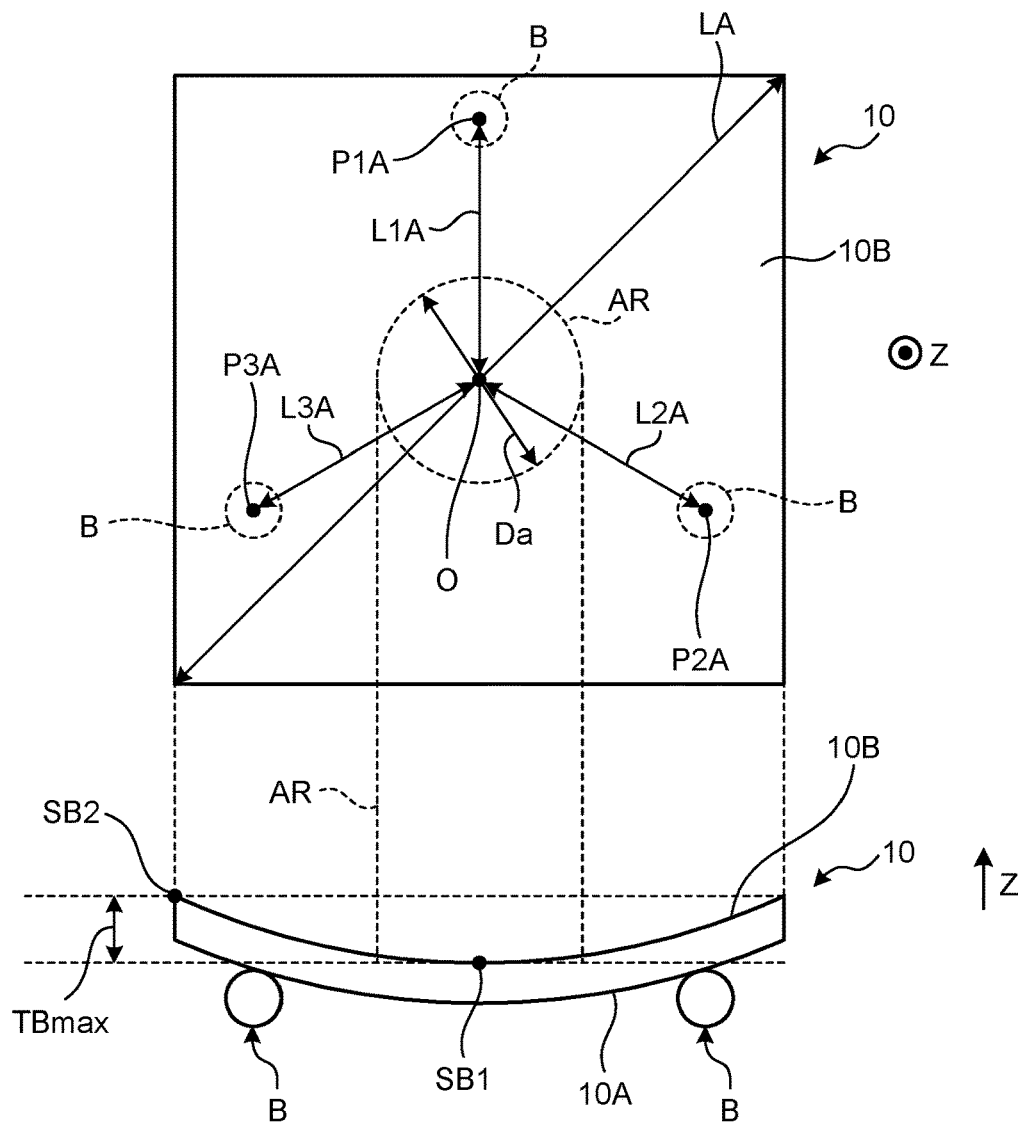
FIG. 3 is a schematic diagram for explaining deflection of the glass substrate according to the present embodiment.
Figure 4:
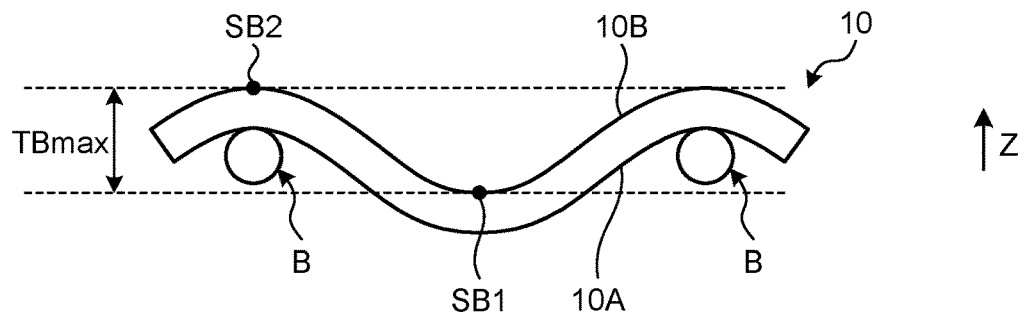
FIG. 4 is a schematic diagram for explaining deflection of the glass substrate according to the present embodiment.

FIG. 3 and FIG. 4 are schematic diagrams for explaining deflection of the glass substrate according to the present embodiment. FIG. 3 is a diagram for explaining an example of deflection due to self-weight in a case of supporting, by supporting members B, three points including a first position PIA, a second position P2A, and a third position P3A on an outer side in the radial direction with respect to the center point O of the glass substrate 10 when viewed from the Z-direction. The first position PIA is a position on the surface 10A that is distant from the center point O of the glass substrate 10 by a distance L1A toward the outer side in the radial direction. The second position P2A is a position on the surface 10A that is distant from the center point O of the glass substrate 10 by a distance L2A toward the outer side in the radial direction, and is a position shifted from the first position PIA by 120 degrees in the circumferential direction assuming that the center point O is the center. The third position P3A is a position on the surface 10A that is distant from the center point O of the glass substrate 10 by a distance L3A toward the outer side in the radial direction, and is a position shifted from the first position PIA and the second position P2A by 120 degrees in the circumferential direction assuming that the center point O is the center. The radial direction herein means a radial direction assuming that the center point O is the center. The distance L1A, the distance L2A, and the distance L3A are the same length. For example, the distance L1A is an optional length that is equal to or more than half of a length of the straight line passing through the first position PIA from the center point O to the peripheral part of the glass substrate 10, the distance L2A is an optional length that is equal to or more than half of a length of the straight line passing through the second position P2A from the center point O to the peripheral part of the glass substrate 10, and the distance L3A is an optional length that is equal to or more than half of a length of the straight line passing through the third position P3A from the center point O to the peripheral part of the glass substrate 10. In the example of FIG. 3, a length from the first position PIA to the peripheral part of the glass substrate 10 along the straight line passing through the first position PIA from the center point O is 10 mm, a length from the second position P2A to the peripheral part of the glass substrate 10 along the straight line passing through the second position P2A from the center point O is 10 mm, and a length from the third position P3A to the peripheral part of the glass substrate along the straight line passing through the third position P3A from the center point O is 10 mm. The supporting member B may be a spherical-shaped member having a diameter equal to or larger than 1 mm and equal to or smaller than 2 mm, and the diameter is more preferably 1.6 mm. Material of the supporting member B is preferably material that is softer than glass is and is hardly deformed due to temperature, humidity, or glass weight during measurement. For example, the material is resin such as polyetheretherketone (PEEK) and polytetrafluoroethylene (PTFE), and the PEEK may be used herein.

As illustrated in FIG. 3, in a case in which the surface 10A of the glass substrate 10 is directed downward in a vertical direction, and the first position PIA, the second position P2A, and the third position P3A on the surface 10A are supported by the supporting members B, a position where the height in the vertical direction is the lowest on the surface 10B on an upper side in the vertical direction is defined as a lowest point SB1. That is, it can be said that the lowest point SB1 is a position where a deflection amount becomes the largest on the surface 10B. In this case, it is preferable that the lowest point SB1 be positioned in a central region AR when viewed from the vertical direction (Z-direction). The central region AR is a region on an inner side in the radial direction with respect to the first position PIA, the second position P2A, and the third position P3A. More specifically, the central region AR is a circular region the center of which is the center point O and a diameter Da of which has a length of ⅓ of a diameter LA of the glass substrate 10.

In this way, in a case in which the surface 10A of the glass substrate 10 is directed downward in the vertical direction and the three points including the first position PIA, the second position P2A, and the third position P3A on the surface 10A are supported by the supporting members B, the lowest point SB is preferably positioned in the central region AR. Regarding the glass substrate 10, the lowest point SB is positioned in the central region AR instead of the outside of the central region AR, so that deformation such that a deflected position of the glass substrate 10 is shifted is suppressed at the time of manufacturing the semiconductor device, for example, and deterioration of the manufacturability of the semiconductor device can be suppressed.

In a case in which the surface 10A of the glass substrate 10 is directed downward in the vertical direction and the first position P1A, the second position P2A, and the third position P3A on the surface 10A are supported by the supporting members B, a maximum deflection amount of the glass substrate 10 is defined as a maximum deflection amount TBmax. It can be said that the maximum deflection amount TBmax is a maximum deflection amount due to self-weight of the glass substrate 10, and is a distance along the vertical direction from a highest point SB2 of the glass substrate 10 to the lowest point SB1. The highest point SB2 is a position at which the height in the vertical direction is the highest on the surface 10B on an upper side in the vertical direction in a case in which the surface 10A of the glass substrate 10 is directed downward in the vertical direction and the first position P1A, the second position P2A, and the third position P3A on the surface 10A are supported by the supporting members B. In this case, in a case in which the length L of the glass substrate 10 is equal to or larger than 300 mm and equal to or smaller than 1000 mm, and the thickness D is equal to or smaller than 4.0 mm, the maximum deflection amount TBmax is preferably equal to or smaller than 10 mm, and more preferably equal to or larger than 0 mm and equal to or smaller than 5 mm. By causing the maximum deflection amount TBmax to fall within this range, the deflection amount can be suppressed, so that deterioration of the manufacturability of the semiconductor device can be suppressed more preferably.

FIG. 3 illustrates an example of a case in which the glass substrate 10 is simply warped, but warpage of the glass substrate 10 is not limited to simple warpage as illustrated in FIG. 3. For example, the glass substrate 10 may be warped as illustrated in FIG. 4. That is, although the glass substrate 10 is deflected to have a concave shape concaved from an outer peripheral end toward the lowest point SB1 in FIG. 3, the glass substrate 10 may be deflected to be concaved from a point supported by the supporting member B toward the lowest point SB1 and also concaved from a point supported by the supporting member B toward the outer peripheral end as illustrated in FIG. 4.

In the above description, described is deflection of the glass substrate 10 in a case in which the surface 10A is directed downward in the vertical direction. In the following description, it is preferable that the same apply to deflection of the glass substrate 10 in a case in which the surface 10B is directed downward in the vertical direction.

(Warpage Amount of Glass Substrate)

Herein, a warpage amount of the glass substrate 10 excepting deflection due to self-weight is defined as a warpage amount $\Delta T$. In this case, the warpage amount $\Delta T$ is preferably equal to or smaller than 1.0 mm, more preferably equal to or smaller than 0.5 mm, and even more preferably equal to or smaller than 0.1 mm. By causing the warpage amount $\Delta T$ to fall within this range, warpage of the semiconductor device manufactured on the glass substrate 10 can be suppressed, and deterioration of the manufacturability of the semiconductor device can be suppressed more preferably. The warpage amount $\Delta T$ is a value obtained by dividing, by 2, a maximum value of differences in the deflection amounts at respective positions (respective coordinates) on a plane along the surface of the glass substrate 10 between the case in which the surface 10B is directed downward in the vertical direction and supported by the supporting members B as described above and the case in which the surface 10A is directed downward in the vertical direction and supported by the supporting members B as described above. That is, $TA_{(i)}$ is defined as a deflection amount at a position (coordinates) i on a plane along the surface of the glass substrate 10 in a case in which the surface 10B is directed downward in the vertical direction and supported by the supporting members B as described above, and $TB_{(i)}$ is defined as a deflection amount at a position (coordinates) i on the plane along the surface of the glass substrate 10 in a case in which the surface 10A is directed downward in the vertical direction and supported by the supporting members B as described above. The largest value among differences between the deflection amount $TA_{(i)}$ and the deflection amount $TB_{(i)}$ at the respective positions i is defined as MAX $(TA_{(i)}-TB_{(i)})$. In this case, the warpage amount $\Delta T$ can be obtained by the following expression (1). That is, the warpage amount $\Delta T$ is a value obtained by dividing an absolute value of MAX($TA_{(i)}-TB_{(i)}$) by 2.

$$\Delta T=|\mathrm{MAX}(TA_{(i)}-TB_{(i)})|/2 \qquad (1)$$

(End Face Shape of Glass Substrate)

Figure 2B:
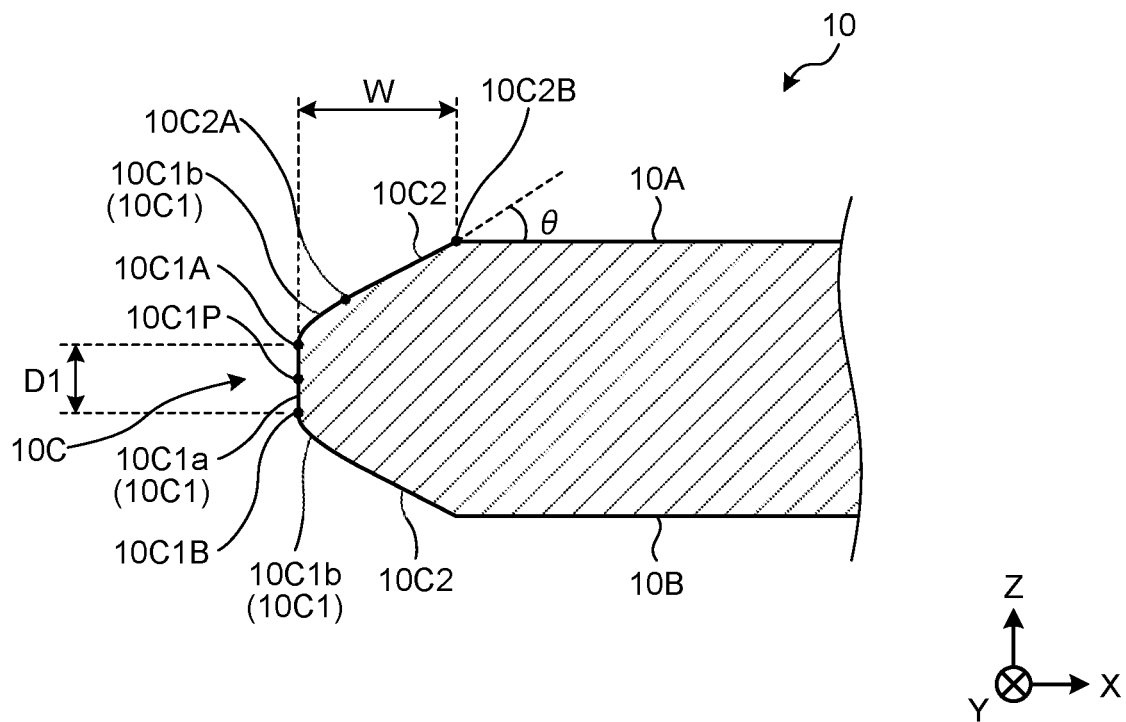
FIG. 2B is a partial enlarged view of FIG. 2A.

FIG. 2B is a partial enlarged view of FIG. 2A. As illustrated in FIG. 2B, the end face part 10C1 includes a linear part 10C1a and curved parts 10C1b. More specifically, the end face part 10C1 includes the curved parts 10C1b on both sides in the Z-direction of the linear part 10C1a, and is connected to the edge surface parts 10C2 via the curved parts 10C1b. That is, the end face of the glass substrate 10 is configured by the edge surface part 10C2 on the surface 10B side, the curved part 10C1b on the surface 10B side, the linear part 10C1a on the surface 10A side, the curved part 10C on the surface 10A side, and the edge surface part 10C2 on the surface 10A side in this order in the Z-direction.

The linear part 10C1a is a region in which a locus obtained by tracing the end face part 10C1 along the Z-direction is regarded as a straight line, and the curved part 10C1b is a region in which a locus obtained by tracing the end face part 10C1 along the Z-direction is curved. The curved part 10C1b has an R shape that is inclined inward in the radial direction as being closer to an outer side (side of the surface 10A or the surface 10B) from the center of the glass substrate 10 in the Z-direction. More specifically, in a case of defining the center point in the Z-direction of the end face 10C as a middle point 10C1P and tracing the end face 10C from the middle point 10C1P toward one side in the Z-direction (the surface 10A side), a boundary position 10C1A is defined as a position to which the traced locus has moved by 10 μm inwardly in the radial direction (X-direction in the example of FIG. 2B) of the glass substrate 10 excluding unevenness of a finished surface. In a case of tracing the end face 10C from the middle point 10C1P toward the opposite side in the Z-direction (the surface 10B side), similarly, a boundary position 10C1B is defined as a position to which the traced locus has moved by 10 μm inwardly in the radial direction (X-direction in the example of FIG. 2B) of the glass substrate 10 excluding unevenness of the finished surface. That is, it can be said that a distance between the boundary position 10C1A and the middle point 10C1P in the radial direction of the glass substrate 10, and a distance between the boundary position 10C1B and the middle point 10C1P in the radial direction of the glass substrate 10 are both 10 μm. In this case, of the end face part 10C1, the region between the boundary position 10C1A and the boundary position 10C1B is the linear part 10C1a, and the region on a side in the Z-direction (surface 10A side) extending from the boundary position 10C1A and the region on the opposite side (surface 10B side) in the Z-direction extending from the boundary position 10C1B are the curved parts 10C1b. That is, the locus obtained by tracing the linear part 10C1a in the Z-direction can be regarded as a straight line because a displacement in the radial direction of the glass substrate 10 is small, but the locus obtained by tracing the curved part 10C1b in the Z-direction has a curved shape that is displaced in the radial direction of the glass substrate 10.

A boundary position between the curved part 10C1b and the edge surface part 10C2 is defined as a boundary position 10C2A. That is, it can be said that the region from the boundary position 10C1A to the boundary position 10C2A is the curved part 10C1b, and a region from the boundary position 10C2A to a boundary position 10C2B between the edge surface part 10C2 and the surface 10A (surface 10B) is the edge surface part 10C2. The boundary position 10C2A can be defined as follows. That is, a position on the end face 10C can be called the boundary position 10C2A, the position separated from a straight line, which is inclined by an angle θ with respect to the surface 10A (that is, a straight line along the edge surface 10C2), by 10 μm in a direction vertical to the edge surface 10C2. That is, the locus obtained by tracing the edge surface part 10C2 in the Z-direction can be regarded as a straight line because a displacement in the radial direction of the glass substrate 10 is small, but the locus obtained by tracing the curved part 10C1b in the Z-direction has a curved shape that is displaced in the radial direction of the glass substrate 10.

In this way, in the glass substrate 10, the curved part 10C1b as the R shape is formed between the linear part 10C1a and the edge surface part 10C2. Such a shape can be achieved by adjusting a shape of a grindstone or a grit size of the grindstone count, for example. However, the glass substrate 10 does not necessarily include the curved part 10C1b. In this case, the linear part 10C1a may be directly connected to the edge surface part 10C2.

(Length of Linear Part)

A length D1 in the Z-direction of the linear part 10C1a is preferably equal to or smaller than 50% of the thickness D of the glass substrate 10, and preferably equal to or larger than 5% and equal to or smaller than 45% thereof. By causing the length D1 to fall within this range, a crack from the end face 10C can be suppressed, and the semiconductor device can be appropriately manufactured.

More specifically, the length D1 is not too small as compared with the thickness D, so that it is possible to prevent the end part from being sharpened and becoming vulnerable to contact of foreign substances. The length D1 is not too large as compared with the thickness D, and there is almost no chamfered part and an angle becomes very small, so that it is possible to prevent the boundary part on the end face side from being easily cracked at the time of contact with a foreign substance. The length D1 indicates a length in the Z-direction from the boundary position 10C1A to the boundary position 10C1B. The length D1 can be measured, for example, by acquiring a sectional image of a vicinity of the end face 10C by image photographing or contact-type measurement.

(Angle of Edge Surface Part)

As illustrated in FIG. 2A, the angle θ of the edge surface part 10C2 is preferably equal to or larger than 15° and equal to or smaller than 80°, and more preferably equal to or larger than 20° and equal to or smaller than 60°. By causing the angle θ to fall within this range, a crack from the end face 10C can be suppressed, and the semiconductor device can be appropriately manufactured. The angle θ indicates an angle formed by a straight line along the edge surface part 10C2 and a straight line along the surface of the glass substrate 10 (the surface 10A in the example of FIG. 2A) when viewed from a direction orthogonal to the Z-direction. The angle θ of the edge surface part 10C2 on the one side in the Z-direction side (surface 10A side) and the angle θ of the edge surface part 10C2 on the opposite side in the Z-direction (surface 10B side) are preferably the same, but the embodiment is not limited thereto. They may be different values for the purpose of discriminating between the back and front, for example. The angle θ can be measured, for example, by acquiring a sectional image of the vicinity of the end face 10C by image photographing or contact-type measurement.

A deviation of the angle θ of the edge surface part 10C2 is preferably equal to or smaller than 20 degrees, and more preferably equal to or smaller than 10 degrees. By causing the deviation of the angle θ to fall within this range, a crack from the end face 10C can be suppressed, and the semiconductor device can be appropriately manufactured. The deviation of the angle θ indicates a deviation of the angle θ for each position on the edge surface part 10C2, and is defined as a deviation of a differential angle θ between a maximum value and a minimum value of angles θ at the respective positions. In this case, for example, for each position on the edge surface part 10C2, the angle θ at this position is calculated. More specifically, the glass substrate 10 according to the present embodiment is a rectangle, so that the angle θ is calculated for each position along the X-direction for the edge surface part 10C2 of the side along the X-direction, and the angle θ is calculated for each position along the Y-direction for the edge surface part 10C2 of the side along the Y-direction. A difference between the maximum value and the minimum value of the angles θ at the respective positions may be defined as the deviation of the angle θ.

(Width of Edge Surface Part)

As illustrated in FIG. 2A, a width W of the edge surface part 10C2 is preferably equal to or smaller than 1 mm, and more preferably equal to or larger than 0.1 mm and equal to or smaller than 0.5 mm. By causing the width W to fall within this range, a crack from the end face 10C can be suppressed, and the semiconductor device can be appropriately manufactured. The width W indicates a length in the direction orthogonal to the Z-direction from the boundary position 10C2A to the boundary position 10C2B of the edge surface part 10C2. The width W can be measured, for example, by acquiring a sectional image of the vicinity of the end face 10C by image photographing or contact-type measurement.

A deviation of the width W of the edge surface part 10C2 is preferably equal to or smaller than 0.2 mm, and more preferably equal to or smaller than 0.1 mm. By causing the deviation of the width W to fall within this range, a crack from the end face 10C can be suppressed, and the semiconductor device can be appropriately manufactured. The deviation of the width W indicates a deviation of the width W for each position on the edge surface part 10C2, and the deviation of the width W is defined as a value obtained by dividing a difference between a maximum value and a minimum value of widths W at respective positions by the minimum value of the width W. In this case, for example, for each position on the edge surface part 10C2, the width W at this position is calculated. More specifically, the glass substrate 10 according to the present embodiment is a rectangle, so that the width W is calculated for each position along the X-direction for the edge surface part 10C2 of the side along the X-direction, and the width W is calculated for each position along the Y-direction for the edge surface part 10C2 of the side along the Y-direction. The deviation of the width W may be defined as a value obtained by dividing a difference between a maximum value and a minimum value of the widths W at the respective positions by the minimum value of the width W.

(Shape of Curved Part)

The curved part 10C1b as a boundary portion between the edge surface part 10C2 and the linear part 10C1a preferably has an R shape. A radius of curvature of the curved part 10C1b is preferably equal to or larger than 0.01 mm, more preferably equal to or larger than 0.05 mm, and preferably equal to or smaller than 0.5 mm. By causing the radius of curvature of the curved part 10C1b to fall within this range, a crack from the end face 10C can be suppressed, and the semiconductor device can be appropriately manufactured. The radius of curvature of the curved part 10C1b can be measured, for example, by acquiring a sectional image of the vicinity of the end face 10C by image photographing or contact-type measurement. By way of example, at a boundary part between the edge surface part 10C2 and the linear part 10C1a in a sectional image of the end face 10C viewed from the direction orthogonal to the Z-direction, under a condition excluding influence of an accidental convex point or concave point and roughness that can fall within a range of surface roughness, the radius of curvature of the curved part 10C1b may be defined as a radius of curvature formed by optional three points in a region having the smallest curvature in the boundary region between the edge surface part 10C2 and the linear part 10C1a (that is, the curved part 10C1b). Similarly, a boundary portion between the edge surface part 10C2 and the surface of the glass substrate 10 (the surface 10A and the surface 10B) may have an R shape. In this case, the radius of curvature of the R shape of the boundary portion between the edge surface part 10C2 and the surface of the glass substrate 10 is preferably equal to or larger than 0.05 mm, and more preferably equal to or larger than 0.1 mm and equal to or smaller than half of the thickness. The radius of curvature is preferably equal to or smaller than 0.5 mm. By causing the radius of curvature of the curved part 10C1b to fall within this range, a crack from the end face 10C can be suppressed, and the semiconductor device can be appropriately manufactured.

(Surface Roughness of Surface of Glass Substrate)

An arithmetic mean roughness Ra of the surface of the glass substrate 10 (the surface 10A and the surface 10B) defined by JIS B 0601:2001 is preferably equal to or smaller than 5 nm, and more preferably equal to or larger than 0.5 nm and equal to or smaller than 2.0 nm. By causing the surface roughness to fall within this range, the semiconductor device can be appropriately manufactured. The arithmetic mean roughness Ra of the surface of the glass substrate 10 is calculated by extracting a reference length of a roughness curve of the surface. The reference length may be 5 µm, for example. The arithmetic mean roughness Ra can be measured by AFM manufactured by KEYENCE CORPORATION.

(Surface Roughness of End Face Part of Glass Substrate)

The arithmetic mean roughness Ra of the end face part of the glass substrate 10 defined by JIS B 0601:2001 is preferably equal to or smaller than 5 µm, and more preferably equal to or smaller than 1 µm. By causing the surface roughness to fall within this range, a crack from the end face part 10C1 can be suppressed, and the semiconductor device can be appropriately manufactured. The arithmetic mean roughness Ra of the surface of the end face part 10C1 is calculated by extracting a reference length of a roughness curve of the surface. The reference length may be 128 µm, for example.

The arithmetic mean roughness Ra of the edge surface part 10C2 of the glass substrate 10 defined by JIS B 0601:2001 is preferably equal to or smaller than 5 µm, and more preferably equal to or smaller than 1 µm. By causing the surface roughness to fall within this range, a crack from the edge surface part 10C2 can be suppressed, and the semiconductor device can be appropriately manufactured. The arithmetic mean roughness Ra of the edge surface part 10C2 is calculated by extracting a reference length of a roughness curve of the surface. The reference length may be 128 µm, for example.

(Preferable Shape of Glass Substrate)

By way of example, regarding the glass substrate 10, it is preferable that the thickness D be 1.5 mm, the width W of the edge surface part 10C2 be 0.2 mm, the angle θ of the edge surface part 10C2 be 25°, the length D1 of the linear part 10C1a be 1.3 mm, the radius of curvature of the curved part 10C1b be 0.2 mm, the arithmetic mean roughness Ra of the edge surface part 10C2 be 0.03 µm, and the arithmetic mean roughness Ra of the surface be 0.4 nm. Due to this, the surface roughness is reduced and the strength is improved, so that it is possible to suppress lowering of a yield due to damage of glass or process contamination caused by mixing of a piece of broken glass.

By way of example, regarding the glass substrate 10, it is preferable that the thickness D be 1.5 mm, the width W of the edge surface part 10C2 be 0.2 mm, the angle θ of the edge surface part 10C2 be 30°, the length D1 of the linear part 10C1a be 1.2 mm, the radius of curvature of the curved part 10C1b be 0.2 mm, the arithmetic mean roughness Ra of the edge surface part 10C2 be 0.40 µm, and the arithmetic mean roughness Ra of the surface be 0.9 nm. It is possible to prevent film peeling in a deposition process due to large surface roughness of a glass main surface. Due to this, detectability of the end part can be improved.

By way of example, regarding the glass substrate 10, it is preferable that the thickness D be 1.5 mm, the width W of the edge surface part 10C2 be 0.1 mm, the angle θ of the edge surface part 10C2 be 45°, the length D1 of the linear part 10C1a be 1.1 mm, the radius of curvature of the curved part 10C1b be 0.3 mm, the arithmetic mean roughness Ra of the edge surface part 10C2 be 0.40 µm, and the arithmetic mean roughness Ra of the surface be 0.9 nm. Due to this, an area of the main surface can be increased, and the number of semiconductor devices mounted on the glass substrate can be maximized.

(Young's Modulus of Glass Substrate)

A Young's modulus of the glass substrate 10 is preferably equal to or larger than 50 GPa, more preferably equal to or larger than 70 GPa, and even more preferably equal to or larger than 75 GPa. The Young's modulus of the glass substrate 10 is preferably equal to or smaller than 150 GPa, more preferably equal to or smaller than 130 GPa, and even more preferably equal to or smaller than 120 GPa. By causing the Young's modulus to fall within this range, rigidity of the glass substrate can be prevented from being lowered, and a shape change of the glass substrate can be suppressed, so that deterioration of manufacturability of the semiconductor device can be suppressed. Herein, the Young's modulus of the glass substrate 10 may be a value that is measured based on propagation of ultrasonic waves using 38DL PLUS manufactured by Olympus Corporation.

(Average Thermal Expansion Coefficient of Glass Substrate)

Regarding the glass substrate 10, an average thermal expansion coefficient CTE at 50° C. to 200° C. is preferably equal to or larger than 3 ppm/° C. and equal to or smaller than 12 ppm/° C., and more preferably equal to or larger than 3.2 ppm/° C. and equal to or smaller than 10 ppm/° C. By causing the average thermal expansion coefficient CTE to fall within this range, the glass substrate 10 can be prevented from being damaged. The average thermal expansion coefficient CTE can be measured in conformity to DIN-51045-1 as a standard for thermal expansion measurement. Specifically, for the sample, measurement may be performed in a range from 30° C. to 300° C. using a dilatometer (DIL 402 Expedis) manufactured by NETZSCH as a measurement device, and an average thermal expansion coefficient in a range from 50° C. to 200° C. may be used as the average thermal expansion coefficient CTE.

(Transmittance of Light of Glass Substrate)

Regarding the glass substrate 10, an average transmittance of light having a wavelength equal to or larger than 300 nm and equal to or smaller than 1100 nm is preferably equal to or higher than 50%, and more preferably equal to or higher than 60%. Additionally, regarding the glass substrate 10, an average transmittance of light having a wavelength equal to or larger than 500 nm and equal to or smaller than 1100 nm is preferably equal to or higher than 80%, and more preferably equal to or higher than 90%. By causing the transmittance with respect to the light in this wavelength band to fall within this range, the semiconductor device can be appropriately manufactured. The transmittance can be measured by measuring a spectral transmittance curve using an ultraviolet-visible spectrophotometer (manufactured by Hitachi High-Tech Corporation (U-4150)), for example. The average transmittance is an average value of transmittances of light beams having respective wavelengths in wavelength bands (herein, from 300 nm to 1100 nm, or from 500 nm to 1000 nm).

(Composition of Glass Substrate)

The glass substrate 10 preferably contains the following compounds in mass % (wt %) on an oxide basis. By causing the glass substrate 10 to have the following composition, members can be appropriately supported.

$SiO_2$: preferably equal to or larger than 40 wt % and equal to or smaller than 75 wt %, and more preferably equal to or larger than 50 wt % and equal to or smaller than 75 wt %.

$Al_2O_3$: preferably equal to or larger than 0 wt % and equal to or smaller than 20 wt %, and more preferably equal to or larger than 0 wt % and equal to or smaller than 15 wt %.

$B_2O_3$: preferably equal to or larger than 0 wt % and equal to or smaller than 20 wt %, and more preferably equal to or larger than 0 wt % and equal to or smaller than 10 wt %.

MgO: preferably equal to or larger than 0 wt % and equal to or smaller than 25 wt %.

CaO: preferably equal to or larger than 0 wt % and equal to or smaller than 25 wt %, and more preferably equal to or larger than 0 wt % and equal to or smaller than 15 wt %.

SrO: preferably equal to or larger than 0 wt % and equal to or smaller than 10 wt %.

BaO: preferably equal to or larger than 0 wt % and equal to or smaller than 20 wt %, and more preferably equal to or larger than 0 wt % and equal to or smaller than 15 wt %.

$Li_2O$: preferably equal to or larger than 0 wt % and equal to or smaller than 40 wt %.

$Na_2O$: preferably equal to or larger than 0 wt % and equal to or smaller than 15 wt %.

$K_2O$: preferably equal to or larger than 0 wt % and equal to or smaller than 10 wt %.

$ZrO_2$: preferably equal to or larger than 0 wt % and equal to or smaller than 10 wt %, more preferably equal to or larger than 0 wt % and equal to or smaller than 8 wt %, and even more preferably equal to or larger than 0 wt % and equal to or smaller than 5 wt %.

$TiO_2$: preferably equal to or larger than 0 wt % and equal to or smaller than 5 wt %.

$Y_2O_3$: preferably equal to or larger than 0 wt % and equal to or smaller than 10 wt %.

The glass substrate 10 is configured as described above, so that lowering of dimensional accuracy is suppressed, and the glass substrate 10 is preferably used as a glass substrate that supports the semiconductor device.

Regarding the glass substrate 10, a mark described in WO 2018/150759 may be provided at an optional place on the glass substrate 10.

(Manufacturing Method for Glass Substrate)

Figure 5:
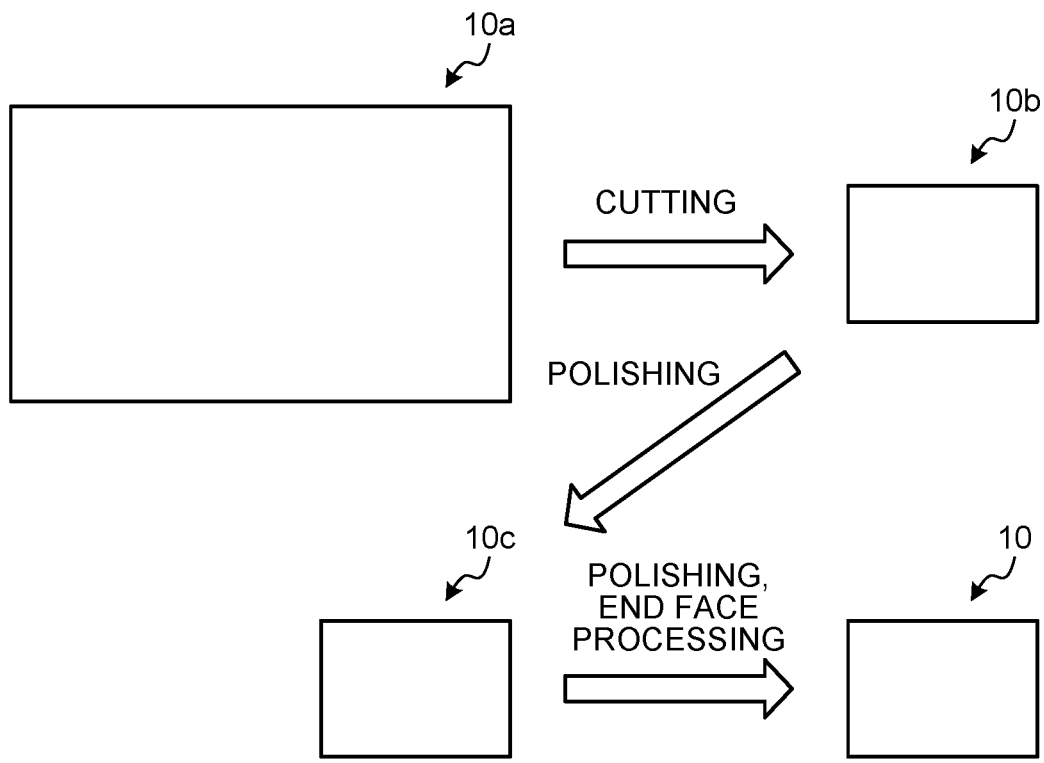
FIG. 5 is a schematic diagram for explaining a manufacturing method for the glass substrate according to the present embodiment.

Next, the following describes a manufacturing method for the glass substrate 10 according to the present embodiment. FIG. 5 is a schematic diagram for explaining the manufacturing method for the glass substrate according to the present embodiment. In this manufacturing method, as illustrated in FIG. 5, a glass base plate 10a is prepared, the glass base plate 10a is subjected to cut processing to generate a glass blank 10b, a surface of the glass blank 10b is polished to generate a glass plate 10c, and a surface of the glass plate 10c is further polished while being subjected to end face processing to manufacture the glass substrate 10.

Figure 6:
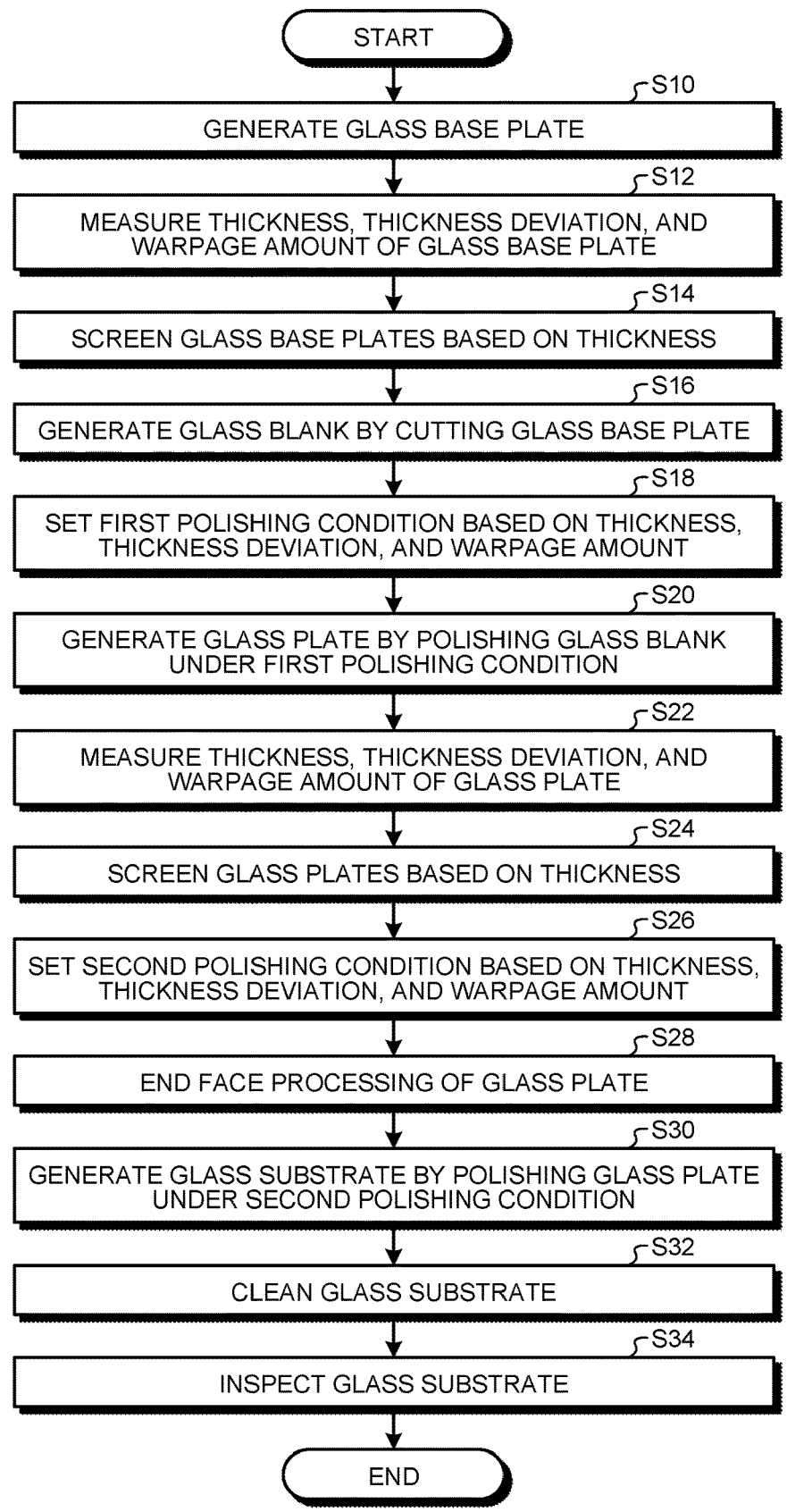
FIG. 6 is a flowchart for explaining the manufacturing method for the glass substrate according to the present embodiment.

The following more specifically describes the manufacturing method for the glass substrate 10 according to the present embodiment. FIG. 6 is a flowchart for explaining the manufacturing method for the glass substrate according to the present embodiment.

(Glass Base Plate Generation Step)

As illustrated in FIG. 6, in this manufacturing method, the glass base plate 10a is generated (Step S10: glass base plate generation step). The glass base plate 10a is a plate-shaped piece of glass as a base material of the glass substrate 10. In the present embodiment, for example, at the glass base plate generation step, a glass raw material may be caused to be in a glass state to generate the glass base plate 10a having a desired composition through an optional glass melting and molding method such as float molding, fusion molding, or ingot molding, and through machining such as slicing as needed. At the glass base plate generation step, the glass base plate 10a having an optional size may be generated. For example, it is possible to generate the glass base plate 10a in which a length of one side is equal to or larger than 300 mm and equal to or smaller than 1000 mm, and a thickness is equal to or larger than 0.5 mm and equal to or smaller than 4 mm.

(Glass Base Plate Measurement Step)

Next, in this manufacturing method, a thickness, a thickness deviation, and a warpage amount of the generated glass base plate 10a are measured (Step S12: glass base plate measurement step). At the glass base plate measurement step, for example, the thickness may be measured at each position (each pair of coordinates) on a plane along the surface (principal plane) of the glass base plate 10a, and an average value of thicknesses at respective positions may be defined as the thickness of the glass base plate 10a. However, the thickness of the glass base plate 10a is not limited to the average value of the thicknesses at the respective positions. For example, the thickness at a predetermined position such as a center position of the glass base plate 10a may be defined as the thickness of the glass base plate 10a, or a maximum value or a minimum value of the thicknesses at the respective positions may be defined as the thickness of the glass base plate 10a. To measure the thickness, a laser displacement gauge may be used.

At the glass base plate measurement step, a thickness deviation of the glass base plate 10a is measured. The thickness deviation indicates a deviation of the thickness for each position (each pair of coordinates) on the plane along the surface of the glass base plate 10a. For example, the thickness is measured for each position (each pair of coordinates) on the plane along the surface of the glass base plate 10a, and a difference between a maximum value and a minimum value of thicknesses at respective positions may be defined as the thickness deviation.

At the glass base plate measurement step, a warpage amount of the glass base plate 10a is measured. The warpage amount of the glass base plate 10a indicates a warpage amount excepting deflection due to self-weight. The warpage amount of the glass base plate 10a is a value obtained by dividing, by 2, a maximum value of a difference in the deflection amount for each position (each pair of coordinates) on the plane along the surface of the glass base plate 10a between a case of supporting one surface of the glass base plate 10a by the supporting members B using the same method as that in the description of FIG. 3 and a case of supporting the other surface of the glass base plate 10a by the supporting members B using the same method as that in the description of FIG. 3. That is, $TAa_{(i)}$ is assumed to be a deflection amount at a position (coordinates) i on the plane along the surface of the glass base plate 10a in a case in which the one surface of the glass base plate 10a is directed downward in the vertical direction and supported by the supporting members B, and $TBa_{(i)}$ is assumed to be a deflection amount at the position (coordinates) i on the plane along the surface of the glass base plate 10a in a case in which the other surface of the glass base plate 10a is directed downward in the vertical direction and supported by the supporting members B. The largest value among differences between the deflection amount $TAa_{(i)}$ and the deflection amount $TBa_{(i)}$ at respective positions i is defined as MAX $(TAa_{(i)}-TBa_{(i)})$. In this case, the warpage amount $\Delta Ta$ of the glass base plate 10a can be obtained by the following expression (2). That is, the warpage amount $\Delta Ta$ is a value obtained by dividing an absolute value of MAX $(TAa_{(i)}-TBa_{(i)})$ by 2.

$$\Delta Ta = |MAX(TAa_{(i)} - TBa_{(i)})|/2 \qquad (2)$$

(Glass Base Plate Screening Step)

Next, in this manufacturing method, the glass base plate 10a is screened based on the measured thickness of the glass base plate 10a (Step S14: glass base plate screening step). That is, at the glass base plate screening step, a plurality of the glass base plates 10a are classified by thickness. For example, at the glass base plate screening step, a range between an upper limit value and a lower limit value of a possible thickness of the glass base plate 10a is divided into a plurality of numerical ranges, and the glass base plate 10a to be a screening target is assigned to a group of a numerical range including the thickness of that glass base plate 10a. At the glass base plate screening step, similar screening is performed for each of the glass base plates 10a, and each of the glass base plates 10a is assigned to any of the groups. In a case in which the thickness of the glass base plate 10a is outside the range between the upper limit value and the lower limit value, the glass base plate 10a may be excluded as a defective product. By screening the glass base plate 10a based on the thickness as described above, a polishing margin can be determined for each group, for example, so that variation in the thickness of the glass substrates 10 to be manufactured can be reduced.

In this way, in the present embodiment, the glass base plate 10a is screened by using the thickness among the measured thickness, thickness deviation, and warpage amount. However, the embodiment is not limited thereto. The glass base plate 10a may be screened by using also the thickness deviation and the warpage amount. That is, at the glass base plate screening step, the glass base plate 10a may be screened based on at least one of the thickness, the thickness deviation, and the warpage amount. Screening based on the thickness deviation or the warpage amount may be performed by using the same method as that for screening based on the thickness. That is, for example, the range between a possible upper limit value and lower limit value of the thickness deviation or the warpage amount is divided into a plurality of numerical ranges, and the glass base plate 10a to be a screening target is assigned to a group of a numerical range including the thickness deviation or the warpage amount of that glass base plate 10a.

(Glass Blank Generation Step)

Next, in this manufacturing method, the glass base plate 10a is cut to generate the glass blank 10b (Step S16: glass blank generation step). At the glass blank generation step, the glass base plate 10a is cut by machining to generate a plurality of the glass blanks 10b. It can be said that the glass blank 10b is a glass substrate before polishing. At the glass blank generation step, the glass base plate 10a may be cut by using an optional method. For example, laser processing with laser light, machining with a diamond wheel, and the like may be used. At the glass blank generation step, the glass blank 10b having an optional size may be generated. For example, the glass blank 10b in which a length of one side is equal to or larger than 300 mm and equal to or smaller than 1000 mm, and a thickness is equal to or larger than 0.5 mm and equal to or smaller than 4 mm, may be generated.

(First Polishing Condition Setting Step)

Next, in this manufacturing method, a first polishing condition for the glass blank 10b is set based on the thickness, the thickness deviation, and the warpage amount of the glass base plate 10a (Step S18: first polishing condition setting step). The first polishing condition is a polishing condition for polishing the surface of the glass blank 10b, and is a polishing condition for achieving a predetermined level of thickness, thickness deviation, and warpage amount of the glass base plate 10a. At the first polishing condition setting step, the first polishing condition is set for each of the glass blanks 10b. By setting the first polishing condition based on the thickness, the thickness deviation, and the warpage amount, it is possible to suppress lowering of dimensional accuracy of the glass substrate 10 to be manufactured.

More specifically, at the first polishing condition setting step, a polishing margin of the glass blank 10b as the first polishing condition is determined based on the thickness of the glass base plate 10a. The polishing margin indicates a thickness of the glass blank 10b to be removed by polishing, and can also be said to be a difference value between the thickness of the glass blank 10b before polishing and the thickness of the glass blank 10b after polishing. More specifically, at the first polishing condition setting step, the polishing margin is determined based on a screening result (screened group) at the glass base plate screening step. That is, the polishing margin is set in advance for each group of the thickness of the glass base plate 10a, and at the first polishing condition setting step, the polishing margin set for a group of the glass base plate 10a corresponding to the glass blank 10b to be polished is set as the polishing margin as the first polishing condition.

At the first polishing condition setting step, a polishing method for the glass blank 10b is determined based on the thickness deviation and the warpage amount of the glass base plate 10a. The polishing method is a polishing condition indicating how to polish the glass blank 10b. Examples of the polishing method include a load value applied to the glass blank 10b by a polishing pad and a rotation speed of the polishing pad. For example, a polishing load value at a point having a large thickness is increased, and a polishing amount at a point having a large thickness is selectively increased.

Execution order of Step S14 to Step S18 is not limited to this order, but is optional. For example, Steps S14 and S18 may be executed after executing Step S16, or Step S16 may be executed after executing Steps S14 and S18.

(First Polishing Step)

After setting the first polishing condition, in this manufacturing method, the glass blank 10b is polished under the first polishing condition to generate the glass plate 10c (Step S20: first polishing step). At the first polishing step, the surface of the glass blank 10b is polished under the first polishing condition. That is, at the first polishing step, the surface of the glass blank 10b is polished so that the polishing margin set as the first polishing condition is removed by polishing using the polishing method set as the first polishing condition, and the glass plate 10c is obtained. At the first polishing step, both of one surface (one principal plane) and the other surface (other principal plane) of the glass blank 10b are polished, but the embodiment is not limited thereto. At least one of the one surface and the other surface may be polished. At the first polishing step, the glass plate 10c having an optional thickness may be generated. For example, polishing may be performed so that the thickness of the glass plate 10c becomes equal to or larger than 0.5 mm and equal to or smaller than 4 mm. A scheme of polishing the glass blank 10b is optional, and lapping or surface grinding may be used, for example.

After generating the glass plate 10c, in this manufacturing method, the thickness, the thickness deviation, and the warpage amount of the glass plate 10c are measured (Step S22: glass plate measurement step). At the glass plate measurement step, for example, the thickness may be measured at each position (each pair of coordinates) on a plane along the surface (principal plane) of the glass plate 10c, and an average value of thicknesses at respective positions may be defined as the thickness of the glass plate 10c. However, the thickness of the glass plate 10c is not limited to the average value of the thicknesses at the respective positions. For example, the thickness at a predetermined position such as a center position of the glass plate 10c may be defined as the thickness of the glass plate 10c, or a maximum value or a minimum value of the thicknesses at the respective positions may be defined as the thickness of the glass plate 10c.

At the glass plate measurement step, the thickness deviation of the glass plate 10c is measured. The thickness deviation indicates a deviation of the thickness for each position (each pair of coordinates) on the plane along the surface of the glass plate 10c. For example, the thickness may be measured for each position (each pair of coordinates) on the plane along the surface of the glass plate 10c, and a difference between a maximum value and a minimum value of thicknesses at respective positions may be defined as the thickness deviation.

At the glass plate measurement step, the warpage amount of the glass plate 10c is measured. The warpage amount of the glass plate 10c indicates a warpage amount excepting deflection due to self-weight. The warpage amount of the glass plate 10c is a value obtained by dividing, by 2, a maximum value of a difference in the deflection amount for each position (each pair of coordinates) on the plane along the surface of the glass plate 10c between a case of supporting one surface of the glass plate 10c by the supporting members B using the same method as that in the description of FIG. 3 and a case of supporting the other surface of the glass plate 10c by the supporting members B using the same method as that in the description of FIG. 3. That is, $TAb_{(i)}$ is assumed to be a deflection amount at a position (coordinates) i on the plane along the surface of the glass plate 10c in a case in which the one surface of the glass plate 10c is directed downward in the vertical direction and supported by the supporting members B, and $TBb_{(i)}$ is assumed to be a deflection amount at a position (coordinates) i on the plane along the surface of the glass plate 10c in a case in which the other surface of the glass plate 10c is directed downward in the vertical direction and supported by the supporting members B. The largest value among differences between the deflection amount $TAb_{(i)}$ and the deflection amount $TBb_{(i)}$ at respective positions i is defined as $MAX(TAb_{(i)}-TBb_{(i)})$. In this case, the warpage amount $\Delta Tb$ of the glass plate 10c can be obtained by the following expression (3). That is, the warpage amount $\Delta Tb$ is a value obtained by dividing an absolute value of MAX $(TAa_{(i)}-TBa_{(i)})$ by 2.

$$\Delta Tb = |MAX(TAb_{(i)}-TBb_{(i)})|/2 \qquad (3)$$

(Glass Plate Screening Step)

Next, in this manufacturing method, the glass plate is screened based on the measured thickness of the glass plate 10c (Step S24: glass plate screening step). That is, at the glass plate screening step, a plurality of the glass plates 10c are classified by thickness. For example, at the glass plate screening step, a range between an upper limit value and a lower limit value of a possible thickness of the glass plate 10c is divided into a plurality of numerical ranges, and the glass plate 10c to be a screening target is assigned to a group of a numerical range including the thickness of that glass plate 10c. At the glass plate screening step, similar screening is performed for each of the glass plates 10c, and each of the glass plates 10c is assigned to any of the groups. In a case in which the thickness of the glass plate 10c is outside the range between the upper limit value and the lower limit value, the glass plate 10c may be excluded as a defective product. By screening the glass plate 10c based on the thickness as described above, the polishing margin can be determined for each group, for example, so that the thickness of the glass substrate 10 to be manufactured can be stabilized.

In this way, in the present embodiment, the glass plate 10c is screened by using the thickness among the measured thickness, thickness deviation, and warpage amount. However, the embodiment is not limited thereto. The glass plate 10c may be screened by using also the thickness deviation and the warpage amount. That is, at the glass plate screening step, the glass plate 10c may be screened based on at least one of the thickness, the thickness deviation, and the warpage amount. Screening based on the thickness deviation or the warpage amount may be performed by using the same method as that for screening based on the thickness. That is, for example, the range between a possible upper limit value and lower limit value of the thickness deviation or the warpage amount is divided into a plurality of numerical ranges, and the glass plate 10c to be a screening target is assigned to a group of a numerical range including the thickness deviation or the warpage amount of that glass plate 10c.

(Second Polishing Condition Setting Step)

Next, in this manufacturing method, a second polishing condition for the glass plate 10c is set based on the thickness, the thickness deviation, and the warpage amount of the glass plate 10c (Step S26: second polishing condition setting step). The second polishing condition is a polishing condition for polishing the surface of the glass plate 10c, and is a polishing condition for achieving a predetermined level of thickness, thickness deviation, and warpage amount of the glass plate 10c. At the second polishing condition setting step, the second polishing condition is set for each of the glass plates 10c. By setting the second polishing condition based on the thickness, the thickness deviation, and the warpage amount, it is possible to suppress lowering of dimensional accuracy of the glass substrate 10 to be manufactured.

More specifically, at the second polishing condition setting step, a polishing margin of the glass plate 10c as the second polishing condition is determined based on the thickness of the glass plate 10c. More specifically, at the second polishing condition setting step, the polishing margin is determined based on a screening result (screened group) at the glass plate screening step. That is, the polishing margin is set in advance for each group of the thickness of the glass plate 10c, and at the second polishing condition setting step, the polishing margin set for a group of the glass plate 10c to be polished is set as the polishing margin as the second polishing condition.

At the second polishing condition setting step, a polishing method for the glass plate 10c is determined based on the thickness deviation and the warpage amount of the glass plate 10c. The polishing method is a polishing condition indicating how to polish the glass plate 10c. Examples of the polishing method include a load value applied to the glass plate 10c by the polishing pad and a rotation speed of the polishing pad.

(End Face Processing Step)

Next, in this manufacturing method, the end face (side surface) of the glass plate 10c is processed (Step S28: end face processing step). Specifically, at the end face processing step, the end face of the glass plate 10c is chamfered to form the edge surface part 10C2 on the end face of the glass plate 10c. Due to this, the end face part 10C1 and the edge surface part 10C2 are formed on the end face of the glass plate 10c. The chamfering processing may be performed by an optional method. For example, a rotary grindstone may be brought into contact with the end face to perform chamfering processing, or chamfering processing may be performed by chemical liquid treatment. At the end face processing step, polishing may be performed on the end face part 10C1.

Order of Steps S26 and S28 is optional. For example, Step S26 may be executed after executing Step S28.

(Second Polishing Step)

Next, in this manufacturing method, the glass plate is polished under the second polishing condition to generate the glass substrate 10 (Step S30: second polishing step). Accordingly, the glass substrate 10 described in the present embodiment is manufactured. At the second polishing step, the surface of the glass plate 10c is polished under the second polishing condition. That is, at the second polishing step, the surface of the glass plate 10c is polished so that the polishing margin set as the second polishing condition is removed by polishing using the polishing method set as the second polishing condition, and the glass substrate 10 is obtained. At the second polishing step, both of one surface (one principal plane) and the other surface (other principal plane) of the glass plate 10c are polished. A scheme of polishing the glass plate 10c is optional, and polishing with cerium oxide may be used, for example.

(Cleaning Step)

After manufacturing the glass substrate 10, the glass substrate 10 is cleaned (Step S32: cleaning step). A cleaning method is optional. For example, at least one of cleaning with alkaline detergent, ultrasonic cleaning, and scrub cleaning may be used.

(Inspection Step)

After cleaning the glass substrate 10, the glass substrate 10 is inspected (step S34: inspection step). At the inspection step, dimensions and the like of the glass substrate 10 are measured to inspect the glass substrate 10.

(Effects)

As described above, in the manufacturing method for the glass substrate 10 according to the present embodiment, the glass base plate 10a is generated (glass base plate generation step), the thickness, the thickness deviation, and the warpage amount of the glass base plate 10a are measured (glass base plate measurement step), the glass base plate 10a is screened based on the thickness of the glass base plate 10a (glass base plate screening step), the screened glass base plate 10a is cut to generate a plurality of the glass blanks 10b (glass blank generation step), the first polishing condition for the glass blank 10b is set based on the thickness, the thickness deviation, and the warpage amount of the glass base plate 10a (first polishing condition setting step), the glass plate 10c is generated by polishing the surface of the glass blank 10b based on the first polishing condition (first polishing step), the thickness, the thickness deviation, and the warpage amount of the glass plate 10c are measured (glass plate measurement step), the glass plate 10c is screened based on the thickness of the glass plate 10c (glass plate screening step), the second polishing condition for the glass plate 10c is set based on the thickness, the thickness deviation, and the warpage amount of the glass plate 10c (second condition setting step), and the surface of the screened glass plate 10c is polished based on the second polishing condition to generate the rectangular glass substrate 10 the length of the side of which is equal to or larger than 300 mm and the thickness is equal to or larger than 0.5 mm.

Herein, for the glass substrate that supports the semiconductor device, dimensional accuracy of a thickness and warpage is required. However, the glass substrate that supports the semiconductor device has a relatively large thickness and area, so that high dimensional accuracy is difficult to be secured in some cases. On the other hand, according to this manufacturing method, while variation in the thickness of the glass substrates 10 can be reduced by screening the glass base plate 10a and the glass plate 10c based on the thickness, the thickness and the thickness deviation are caused to be proper values to suppress lowering of dimensional accuracy by setting the first polishing condition and the second polishing condition based on the thickness, the thickness deviation, and the warpage amount.

In this manufacturing method, as the first polishing condition for the glass blank 10b, it is preferable to set the polishing margin of the glass blank 10b based on the screening result of the glass base plate 10a, and set the polishing method based on the thickness deviation and the warpage amount of the glass base plate 10a. Additionally, in this manufacturing method, as the second polishing condition for the glass plate 10c, it is preferable to set the polishing margin of the glass plate based on the screening result of the glass plate 10c, and set the polishing method based on the thickness deviation and the warpage amount of the glass plate 10c. In this manufacturing method, the polishing margin is determined from the screening result based on the thickness, and the polishing method is determined based on the thickness deviation and the warpage amount, so that lowering of dimensional accuracy can be more preferably suppressed.

In this manufacturing method, after polishing the surface of the glass plate 10c (first polishing), the end face of the glass plate 10c is processed (end face processing step). According to this manufacturing method, the end face after the first polishing is processed, so that influence of variation in the plate thickness can be minimized, and lowering of dimensional accuracy of the end face shape can be suppressed.

The glass substrate 10 according to the present embodiment supports the semiconductor device, and it is preferable that the glass substrate 10 have a rectangular shape the length L of the side of which is equal to or larger than 300 mm, the thickness D be equal to or larger than 0.7 mm, the warpage amount ΔT be equal to or smaller than 1 mm, the thickness D be equal to or larger than 0.5 mm and equal to or smaller than 4.0 mm, the deviation of the thickness D be equal to or smaller than 5 μm, the local thickness variation (LTV) in 50 mm×50 mm be equal to or smaller than 2 μm, the width W of the edge surface part 10C2 be equal to or smaller than 1 mm, and the radius of curvature formed by optional three points in the region having the smallest curvature in the boundary region (curved part 10C1b) between the edge surface part 10C2 and the end face part 10C1 (linear part 10C1a) be equal to or larger than 0.05 mm. The glass substrate 10 has such a shape, so that lowering of dimensional accuracy can be suppressed, and the glass substrate 10 is appropriate as a support substrate for the semiconductor device. The glass substrate 10 as described above is preferably manufactured by the manufacturing method described in the present embodiment, but the manufacturing method is not limited thereto. The glass substrate 10 may be manufactured by an optional method.

Working Example 1

Next, the following describes Working example 1. Table 1 is a table indicating examples. A manufacturing process for the glass substrate is different among the examples.

TABLE 1

| | Manufacturing condition | | | | | | | Measurement result | |
|---|---|---|---|---|---|---|---|---|---|
| | Glass base plate generation step | Glass base plate screening step/first polishing condition setting step | Glass blank generation step | First polishing step | Glass plate screening step/second polishing condition setting step | End face processing step | Second polishing step | Warpage amount (mm) | Thickness (mm) |
| Example 1 | Performed | Performed | Performed | Performed | Performed | Performed | Performed | 0.4 | 1.503 |
| Example 2 | Performed | Not performed | Performed | Performed | Not performed | Not performed | Performed | | 1.520 |
| Example 3 | Performed | Performed | Performed | Performed | Not performed | Not performed | Performed | | 1.502 |
| Example 4 | Performed | Not performed | Performed | Performed | Not performed | Performed | Performed | | 1.530 |
| Example 5 | Performed | Performed | Performed | Performed | Not performed | Performed | Performed | | 1.495 |
| Example 6 | Performed | Not performed | Performed | Performed | Performed | Performed | Performed | | 1.497 |

| | Measurement result | | | | Evaluation result | | | | |
|---|---|---|---|---|---|---|---|---|---|
| | Deviation of thickness of entire surface TTV (μm) | LTV of 50 mm × 50 mm (μm) | Width of edge surface part (mm) | Radius of curvature of curved part (mm) | Thickness | Thickness deviation | Process flowability | Total | End face shape |
| Example 1 | 2 | 0.5 | 0.25 | 0.2 | ○ | ○ | ○ | ○ | ○ |
| Example 2 | 12 | 2 | Partially absent | | X | X | X | X | X |
| Example 3 | 10 | | Partially absent | | ○ | Δ | X | X | X |
| Example 4 | 15 | | | | X | X | X | X | ○ |
| Example 5 | 8 | | | | ○ | Δ | X | X | ○ |
| Example 6 | 9 | | | | ○ | Δ | X | X | ○ |

Example 1

In Example 1, the glass base plate generation step was performed, and the glass base plate was generated so that the composition of the glass base plate fell within a range of the composition of the glass substrate 10 according to the present embodiment. The glass base plate screening step was then performed, and the glass base plate was screened based on the thickness. The first polishing condition setting step was performed, and the first polishing condition for the glass blank was set based on the thickness, the thickness deviation, and the warpage amount of the glass base plate. The glass blank generation step was then performed, and the glass base plate was cut to generate the glass blank. The first polishing step was then performed, and the glass blank was polished to generate the glass plate. At the first polishing step, the glass blank was polished based on the first polishing condition. The glass plate screening step was then performed, and the glass plate was screened based on the thickness. The second polishing condition setting step was performed, and the second polishing condition for the glass plate was set based on the thickness, the thickness deviation, and the warpage amount of the glass plate. The end face processing step was performed to process the end face of the glass plate. The second polishing step was then performed, and the glass plate was polished to generate the glass substrate. At the second polishing step, the glass plate was polished based on the second polishing condition.

Example 2

In Example 2, the glass base plate screening step, the first polishing condition setting step, the glass plate screening step, and the second polishing condition setting step were not performed. That is, in Example 2, the polishing condition was not determined based on the thickness, the thickness deviation, and the warpage amount of the glass base plate and the glass plate. In Example 2, the end face processing step was not performed either. The glass substrate was generated under the same conditions as those in Example 1 except the above conditions.

Example 3

In Example 3, the glass plate screening step and the second polishing condition setting step were not performed. That is, in Example 3, the second polishing condition was not determined based on the thickness, the thickness deviation, and the warpage amount of the glass plate. In Example 3, the end face processing step was not performed either. The glass substrate was generated under the same conditions as those in Example 1 except the above conditions.

Example 4

In Example 4, the glass base plate screening step, the first polishing condition setting step, the glass plate screening step, and the second polishing condition setting step were not performed. That is, in Example 4, the polishing condition was not determined based on the thickness, the thickness deviation, and the warpage amount of the glass base plate and the glass plate. The glass substrate was generated under the same conditions as those in Example 1 except the above conditions.

Example 5

In Example 5, the glass plate screening step and the second polishing condition setting step were not performed. That is, in Example 5, the second polishing condition was not determined based on the thickness, the thickness deviation, and the warpage amount of the glass plate. The glass substrate was generated under the same conditions as those in Example 1 except the above conditions.

Example 6

In Example 6, the glass base plate screening step and the first polishing condition setting step were not performed. That is, in Example 6, the first polishing condition was not determined based on the thickness and the thickness deviation of the glass base plate. The glass substrate was generated under the same conditions as those in Example 1 except the above conditions.

(Shape Measurement)

The warpage amount, the thickness, the deviation of the thickness, the LTV, the width of the curved surface part, and the radius of curvature of the curved part of the glass substrate generated in each of Examples respectively indicate the warpage amount ΔT, the thickness D, the deviation of the thickness D, LTV in 50 mm×50 mm, the width W of the edge surface part 10C2, and the radius of curvature of the curved part 10C1b described in the present embodiment, and the measuring method is also the same as described in the present embodiment. Part of the shapes of glass substrates in Example 2 to Example 6 could not be measured due to a high risk of influencing facilities.

(Evaluation)

In evaluation of the thickness, the thickness equal to or larger than 1.49 mm and equal to or smaller than 1.51 mm is represented by a circle, and a plate thickness outside this range is represented by a cross. As evaluation of the thickness deviation, the thickness deviation equal to or smaller than 5 μm is represented by a circle, the thickness deviation larger than 5 μm and equal to or smaller than 10 μm is represented by a triangle, and the thickness deviation larger than 10 μm is represented by a cross. Additionally, a semiconductor device was disposed on the glass substrate in each of the examples, and whether the manufacturing process for the semiconductor device can flow was evaluated. A case in which the manufacturing process can flow is represented by a circle, and a case in which the manufacturing process cannot flow is represented by a cross. When all of the thickness, the thickness deviation, and the process flowability are represented by a circle, the glass substrate is accepted.

In Example 1 as an example, all of the thickness and the thickness deviation are represented by a circle, so that it can be found that lowering of dimensional accuracy is suppressed. Regarding the glass substrate in Example 1, the thickness and the thickness deviation fell within an appropriate range, so that no particular problem was not caused in the process flowability, and the glass substrate was appropriate as a support substrate. On the other hand, in Example 2 to Example 6 as comparative examples, at least one of the thickness and the thickness deviation is represented by a mark other than a circle, so that it can be found that dimensional accuracy is lowered. Regarding the glass substrates in Example 2 and Example 3, the thickness and the thickness deviation did not fall within the appropriate range, and there was an area including no edge surface part, so that the end face could not be recognized, part of the shape could not be measured, and the process could not flow. Regarding the glass substrates in Example 4 to Example 6, the thickness deviation was large, part of the shape could not be measured, and the device could not be properly disposed, so that the process could not flow.

As optional evaluation, an end face shape was evaluated. The length D1 in the Z-direction of the linear part 10C1a in FIG. 2B equal to or larger than 0.1 mm and equal to or smaller than 0.5 mm is represented by a circle, and the length D1 in the Z-direction of the linear part 10C1a smaller than 0.1 mm and larger than 0.5 mm is represented by a cross. In Example 1, and Example 4 to Example 6, the end face processing step is performed, so that lowering of dimensional accuracy of the end face shape is preferably suppressed.

The embodiment of the present invention has been described above, but the embodiment is not limited to the contents of this embodiment. The constituent elements described above include a constituent element that is easily conceivable by those skilled in the art, substantially the same constituent element, and what is called an equivalent. Furthermore, the constituent elements described above can be appropriately combined. In addition, the constituent elements can be variously omitted, replaced, or modified without departing from the gist of the embodiments described above.

REFERENCE SIGNS LIST

10 GLASS SUBSTRATE
10a GLASS BASE PLATE
10b GLASS BLANK
10c GLASS PLATE
10A, 10B SURFACE
10C END FACE
10C1 END FACE PART
10C2 EDGE SURFACE PART

The invention claimed is:

1. A manufacturing method for a glass substrate that supports a semiconductor device, the manufacturing method comprising:
    generating a glass base plate;
    measuring a thickness, a thickness deviation, and a warpage amount of the glass base plate;
    screening the glass base plate based on the thickness of the glass base plate;
    generating a plurality of glass blanks by cutting the screened glass base plate;
    setting a first polishing condition for the glass blank based on the thickness, the thickness deviation, and the warpage amount of the glass base plate;
    generating a glass plate by polishing a surface of the glass blank based on the first polishing condition;
    measuring a thickness, a thickness deviation, and a warpage amount of the glass plate;
    screening the glass plate based on the thickness of the glass plate;
    setting a second polishing condition for the glass plate based on the thickness, the thickness deviation, and the warpage amount of the glass plate; and
    polishing a surface of the screened glass plate based on the second polishing condition to generate a rectangular glass substrate a length of a side of which is equal to or larger than 300 mm and a thickness is equal to or larger than 0.5 mm.

2. The manufacturing method for the glass substrate according to claim 1, comprising:
    setting a polishing margin of the glass blank based on a screening result of the glass base plate, and setting a polishing method based on the thickness deviation and the warpage amount of the glass base plate as a first polishing condition for the glass blank; and
    setting a polishing margin of the glass plate based on a screening result of the glass plate, and setting a polishing method based on the thickness deviation and the warpage amount of the glass plate as a second polishing condition for the glass plate.

3. The manufacturing method for the glass substrate according to claim 1, comprising processing an end face of the glass plate before polishing a surface of the glass plate.

4. A glass substrate that supports a semiconductor device, wherein
    the glass substrate has a rectangular shape a length of a side of which is equal to or larger than 300 mm,
    warpage of the glass substrate is equal to or smaller than 1 mm,
    a plate thickness of the glass substrate is equal to or larger than 0.5 mm and equal to or smaller than 4.0 mm,
    a deviation of the thickness of the glass substrate is equal to or smaller than 5 μm,
    a local thickness variation (LTV) in 50 mm×50 mm of the glass substrate is equal to or smaller than 2 μm,
    a width of an edge surface part of the glass substrate is equal to or smaller than 1 mm, and
    a radius of curvature formed by optional three points in a region having the smallest curvature in a boundary region between the edge surface part and an end face part of the glass substrate is equal to or larger than 0.05 mm.

5. The glass substrate according to claim 4, wherein, a deviation of width of the edge surface part of the glass substrate is equal to or less than 0.2 mm.

6. The glass substrate according to claim 4, wherein, an arithmetic mean roughness Ra of the surface of the glass substrate is equal to or less than 5 nm.

7. The glass substrate according to claim 4, wherein, an arithmetic mean roughness Ra of the end face part of the glass substrate is equal to or less than 5 μm.

8. The glass substrate according to claim 4, wherein, an arithmetic mean roughness Ra of the edge surface part of the glass substrate is equal to or less than 5 μm.

9. The glass substrate according to claim 4, wherein, a Young's modulus of the glass substrate is preferably equal to or greater than 50 GPa and equal to or less than 150 GPa.

10. The glass substrate according to claim 4, wherein, an average thermal expansion coefficient CTE at 50° C. to 200° C. of the glass substrate is equal to or greater than 3 ppm/° C. and equal to or less than 12 ppm/° C.

11. The glass substrate according to claim 4, wherein, an average transmittance of light having a wavelength equal to or greater than 300 nm and equal to or less than 1100 nm of the glass substrate is equal to or greater than 50%.

12. The glass substrate according to claim 4, wherein, the glass substrate comprises,
    $SiO_2$ present in an amount equal to or greater than 40% and equal to or less than 75%,
    $Al_2O_3$ present in an amount equal to or greater than 0% and equal to or less than 20%,
    $B_2O_3$ present in an amount equal to or greater than 0% and equal to or less than 20%,
    MgO present in an amount equal to or greater than 0% and equal to or less than 25%,
    CaO present in an amount equal to or greater than 0% and equal to or less than 25%,
    SrO present in an amount equal to or greater than 0% and equal to or less than 10%,
    BaO present in an amount equal to or greater than 0% and equal to or less than 20%,
    $Li_2O$ present in an amount equal to or greater than 0% and equal to or less than 40%,
    $Na_2O$ present in an amount equal to or greater than 0% and equal to or less than 15%,
    $K_2O$ present in an amount equal to or greater than 0% and equal to or less than 10%,
    $ZrO_2$ present in an amount equal to or greater than 0% and equal to or less than 10%,
    $TiO_2$ present in an amount equal to or greater than 0% and equal to or smaller than 5%, and $Y_2O_3$ present in an amount equal to or greater than 0% and equal to or less than 10%, each measured on an oxide basis based on a total weight of oxides present in the glass substrate.

\* \* \* \* \*